United States Patent [19]

Bauer

[11] Patent Number: 5,414,290

[45] Date of Patent: May 9, 1995

[54] IGBT WITH SELF-ALIGNING CATHODE PATTERN AND METHOD FOR PRODUCING IT

[75] Inventor: Friedhelm Bauer, Suhr, Switzerland

[73] Assignee: ABB Management AG, Baden, Switzerland

[21] Appl. No.: 224,300

[22] Filed: Apr. 7, 1994

[30] Foreign Application Priority Data

May 7, 1993 [DE] Germany .................. 43 15 178.7

[51] Int. Cl.⁶ .................. H01L 27/02; H01L 21/265
[52] U.S. Cl. .................. 257/341; 257/378; 257/401; 437/40; 437/233; 437/913
[58] Field of Search .................. 257/341, 398, 401; 437/40, 233, 913

[56] References Cited

U.S. PATENT DOCUMENTS 5,285,094  2/1994  Mori et al. .................. 257/378
5,321,281  6/1994  Yamaguchi et al. .................. 257/378

FOREIGN PATENT DOCUMENTS 0368246   5/1990  European Pat. Off. .
0390485  10/1990  European Pat. Off. .
0405138   1/1991  European Pat. Off. .
4040993   8/1991  Germany .

OTHER PUBLICATIONS

D. W. Tsang, "A Single Critical Mask Process for Manufacturing Very Large Area . . . ", EPE Journal, vol. 2, No. 2, Jun. 1992, pp. 95–100.

Hefner et al., "A Performance Trade-Off for the Insulated Gate . . . ", IEEE Trans. on Power Electronics, vol. PE-2, No. 3, Jul. 1987, pp. 194–207.

Search Report.

*Primary Examiner*—Edward Wojciechowicz
*Attorney, Agent, or Firm*—Oblon, Spivak, McClelland, Maier & Neustadt

[57] ABSTRACT

An insulated-gate bipolar transistor (IGBT) is specified, the collector (7) and source regions (8) of which can be produced by means of a self-aligning method. This provides an IGBT which is distinguished by a homogeneous turn-off current distribution. For this purpose, the width W of the source regions (8) is selected to be so small that holes can flow laterally into the surrounding collector region. In this connection it must be ensured that the voltage drop across the PN junction of the source regions and collector regions remains below the inherent forward voltage at any time. In consequence, the IGBT according to the invention is particularly insensitive to latch-up.

15 Claims, 4 Drawing Sheets

IGBT WITH SELF-ALIGNING CATHODE PATTERN AND METHOD FOR PRODUCING IT

BACKGROUND OF THE INVENTION

1. Field of the Invention

The invention relates to the field of power electronics.

It is based on an insulated-gate bipolar transistor (IGBT) as claimed in the preamble of the first claim. It furthermore relates to a method for producing an IGBT according to the invention.

2. Discussion of Background

Such an IGBT has already been described in EPA20 405 138.

This IGBT comprises between two main areas, one of which is allocated to a cathode and the other one of which is allocated to an anode, a number of differently doped semiconductor layers. Starting with an n-doped semiconductor substrate, an n+-type barrier layer and a p-type emitter follow in the direction of the anode. The p-type emitter is covered with the anode metallization which forms the anode. From the semiconductor substrate towards the cathode, p-type collector regions, which are preferably of strip-shaped design, are diffused into the first main area. In addition, a number of source regions which are constructed as islands and reach from a channel region, which comprises a part of the collector region underneath the gate electrode, to just in front of the center of the collector strip are in each case inserted into these collector regions. In one collector strip, two source regions are arranged alternately opposite one another from both sides of the collector strip edge so that only one channel region is produced in section transversely to the collector strip. The source regions of one side of the collector strip in each case exhibit a distance D.

It is then the aim of the patent application initially mentioned to specify an IGBT and a method for producing the latter which exhibits high short-circuit strength and high insensitivity to latch-up. This is essentially achieved by the fact that the distance D between two source regions is selected to be greater than twice the width of the channel region.

However, there is still a problem with this IGBT in that the source islands only extend into the collector region up to a certain depth. If the mask for producing the source region is thus slightly misaligned, source islands are obtained which extend farther on one side of the collector region and not as far into the collector region on the other side. Instead, the channel region is narrower on this side. Holes which flow from the anode through to the cathode underneath the source regions are accordingly exposed to a different resistance. Similarly, the latch-up resistance also fluctuates with the misalignment of the source islands.

As a consequence of this, an inhomogeneous turn-off current distribution is obtained. In the case of an inhomogeneous turn-off current distribution, however, the performance of the component is determined by the weakest point of the total power component. The component can therefore only be loaded with the power which the weakest point can be expected to handle. In the final analysis, therefore, a component having reduced efficiency is obtained as a consequence of the misalignment of the source islands.

SUMMARY OF THE INVENTION

Accordingly, one object of the invention is to provide a novel insulated-gate bipolar transistor in which a homogeneous turn-off current distribution is obtained by a pattern which can be produced to be completely self-aligning.

A further object consists in specifying a production method for such a self-aligning pattern.

In an IGBT of the type initially mentioned, this object is achieved by the features of the first claim.

It is thus the core of the invention to select the width of the source regions to be small enough for holes to be able to flow laterally into the surrounding collector region. In this connection, it must be ensured that the voltage drop across the PN junction of the source regions and collector regions remains below the inherent forward voltage at any time. Otherwise, latch-up would occur.

In a preferred illustrative embodiment, the collector regions are constructed to be strip-shaped and the source regions essentially extend over the entire width of the collector strips so that each source region forms one channel region each on both sides.

A further preferred illustrative embodiment is distinguished by the fact that the collector regions form a closed area which is perforated by holes in which the semiconductor substrate comes to the surface. For this special embodiment, various patterns of source regions are specified. The relatively large area of the coherent collector region provides a component which exhibits an increased reverse voltage.

The method according to the invention is particularly distinguished by the fact that the polysilicon layer of the gate electrode is used as implantation mask for the collector regions and, together with a resist cover, also as mask for the source regions. This provides an IGBT, the source regions and collector regions of which are self-aligned. Accordingly, there are no misalignments of the source regions either, resulting in a homogeneous turn-off current distribution.

Further illustrative embodiments are obtained from the subclaims.

The advantage of the IGBT according to the invention thus consists in that the cathode pattern can be produced to be completely self-aligning and thus a homogeneous turn-off distribution over the component can be achieved. As a result, it is not necessary to consider any weakest points in the component and the component can be loaded with the power for which it has been designed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b shows a section of FIG. 1a;

FIG. 2b shows a section of FIG. 2a;

DESCRIPTION OF THE PREFERRED EMBODIMENTS

Figure 1A:
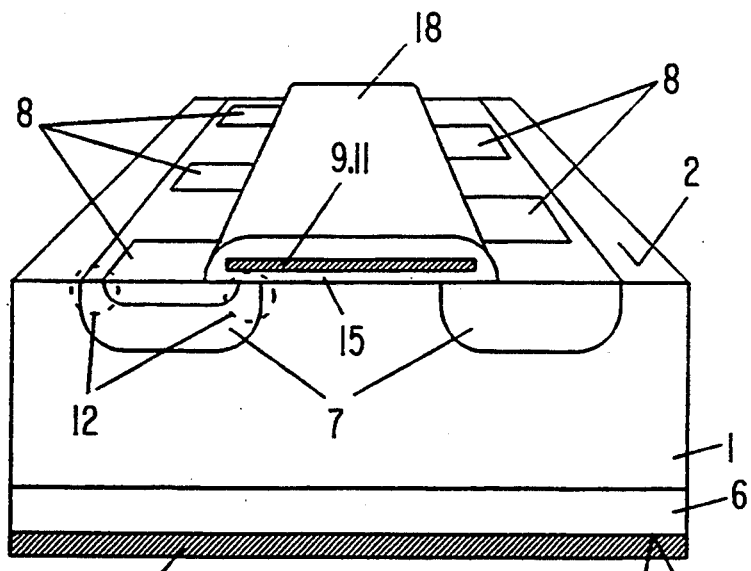
FIG. 1a shows the perspective view of a section of an IGBT according to the invention in accordance with a first variant.

An IGBT according to the invention is composed of a large number of parallel-connected unit cells. Referring now to the drawings, wherein like reference numerals designate identical or corresponding parts throughout the several views, FIG. 1a shows a perspective view of a section of an IGBT having a number of unit cells and comprising a semiconductor substrate (1) of a first, for example n-doped, conduction type. The semiconductor substrate (1) is bounded by a first (2) and a second (3) main area. The second main area (3) is allocated to the anode (5) which is formed by a metallization (11) covering the main area (3). From the anode-side main area, an emitter layer (6) of a second, for example p-doped, conduction type is also inserted. The first main area (2) is allocated to the cathode (4) which is formed by a metal layer covering the first main area (2) and not shown for better clarity. Further collector regions (7) are diffused into the cathode-side main area (2). These collector regions (7) are of the second conduction type, that is to say preferably p-doped. Into the collector regions (7), a number of source regions (8) are diffused in, turn, which themselves are of the first conduction type, that is to say preferably n-doped.

Between the collector regions (7), the semiconductor substrate (1) penetrates to the cathode-side main area (2) and forms the so-called n-type base. Above these n-type base regions, a gate electrode (9) is arranged, insulated by a gate oxide layer (15) from the cathode-side main area, which gate electrode is formed by a conducting gate electrode layer (11) preferably consisting of polysilicon. This gate electrode layer is also covered with a gate electrode insulation (18) which ensures that the gate electrode (9) is insulated from the cathode (4).

Up to now, a conventional IGBT pattern has been described. The current flow from anode (5) to cathode (4) can be turned on and off for such a pattern by applying a control voltage to the gate electrode (9). Due to the application of a control voltage to the gate (9), a conducting channel forms in the collector region (7) between the source region (8) and the semiconductor substrate penetrating to the surface. This special region is designated as channel region (12).

An IGBT, like a bipolar transistor, essentially has a three-level structure which is formed by the collector region (7), the semiconductor substrate (1) and the emitter (6). In addition to this three-level structure, however, there is a four-level structure. This parasitic thyristor comprises the source region (8), the collector region (7), the semiconductor substrate (1) and the emitter (6).

If, then, a hole current flows from the anode (5) to the cathode (4), the holes flow directly underneath the source regions (8). This results in a voltage drop. If this voltage drop becomes higher than the inherent forward voltage of the PN junction of the collector regions (7) and the source regions (8), the PN junction is polarized in a forward direction and electrons are injected from the source regions (8) into the collector regions (7). This triggers the parasitic thyristor, with the consequence that the current flow can no longer be controlled by applying a control voltage to the gate (9). This unwanted effect is called latch-up.

An IGBT should also exhibit the highest possible short-circuit current carrying capability. This is essentially determined by the spacing of the source regions. The voltage drop which leads to latch-up is dependent on, among other things, the length of the source regions.

In EP 0 405 138 initially mentioned, it is therefore attempted to make an IGBT more resistive to latch-up and more capable of handling short-circuit loads in that the source regions are restricted in their length and do not even extend to half the width of the strip-shape collector region, and the spacing of two source regions is selected to be greater than twice the width of the channel region.

In production, however, it is scarcely possible to avoid the mask for producing the source regions from being slightly misaligned laterally. This results in source regions which extend slightly closer to the center of the collector regions on one side and source regions which are displaced towards the semiconductor substrate on the other side.

This leads to an inhomogeneous turn-off current distribution. As a result, the component may only be operated at the power which is sustainable by the most sensitive point. The characteristics of the IGBT are thus severely impaired by the misalignment of the source region mask.

Figure 1B:
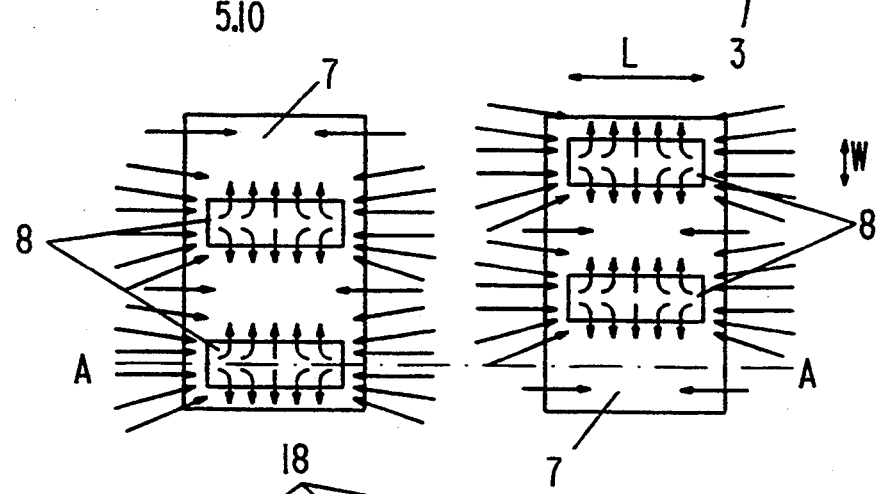

This is avoided in the present invention in that, as is shown in FIG. 1b, the width W of the source regions (8) is selected to be so small that the holes coming from the anode cannot flow along the source regions (8) but can flow laterally into the surrounding collector region (7). The width of the source regions (8) is thus designed in such a manner that the forward polarization of the PN junction mentioned remains below the inherent forward voltage even in the case of extremely high hole current densities. This effectively prevents the injection of electrons and thus latch-up. The width of the source regions is of the order of magnitude of $\mu$m.

Figure 1C:
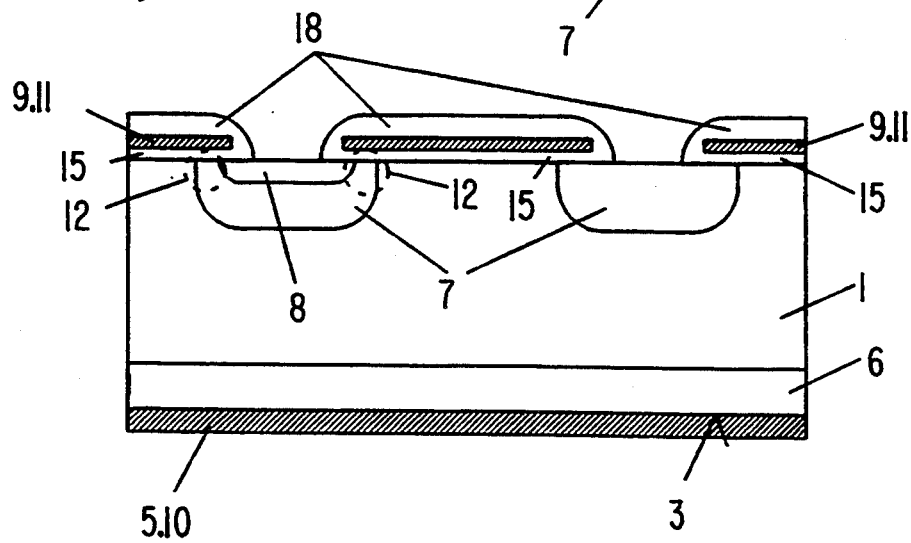
FIG. 1c shows the IGBT according to FIG. 1a in section along plane A—A.

FIGS. 1a and 1c show a preferred embodiment with a strip-shaped arrangement of the collector regions (7). In such an arrangement, it becomes possible to extend the length L of the source regions (8) by such an amount that the source regions (8) extend virtually over the entire width of the collector strips (7). Thus, at least two channel regions (12) are formed per source region (8). This opens the way for using the polysilicon layer as injection mask both for the collector regions (7) and for the source regions (8) during the production. Accordingly, these two regions are self-aligned and it is no longer possible for a loss of power to occur due to misalignment of the source regions (8).

In FIGS. 1a–c, the source regions (8) of two different collector regions (7) are arranged alternately opposite one another. This means that source regions are inserted in a collector region at the loctions where intermediate areas of the collector region exist in the other collector region, and conversely.

Figure 2A:
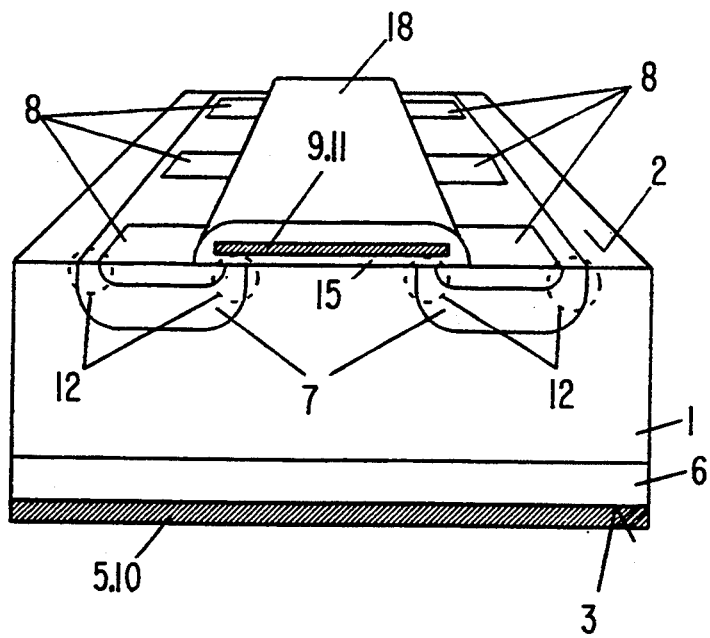
FIG. 2a shows the perspective view of a section of an IGBT according to the invention in accordance with a second variant.
Figure 2B:
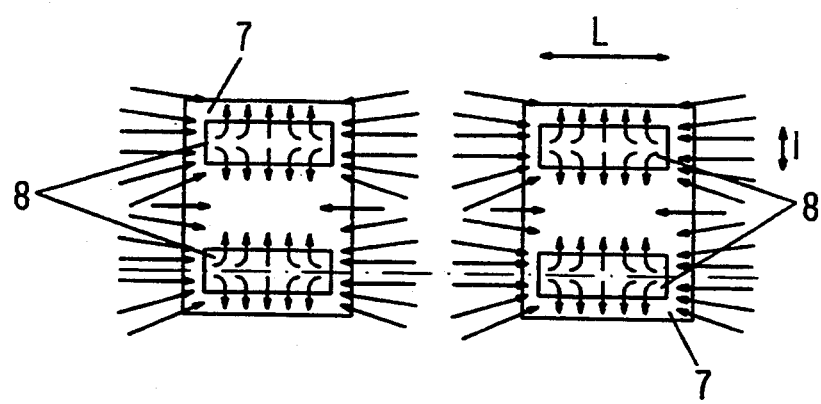
Figure 2C:
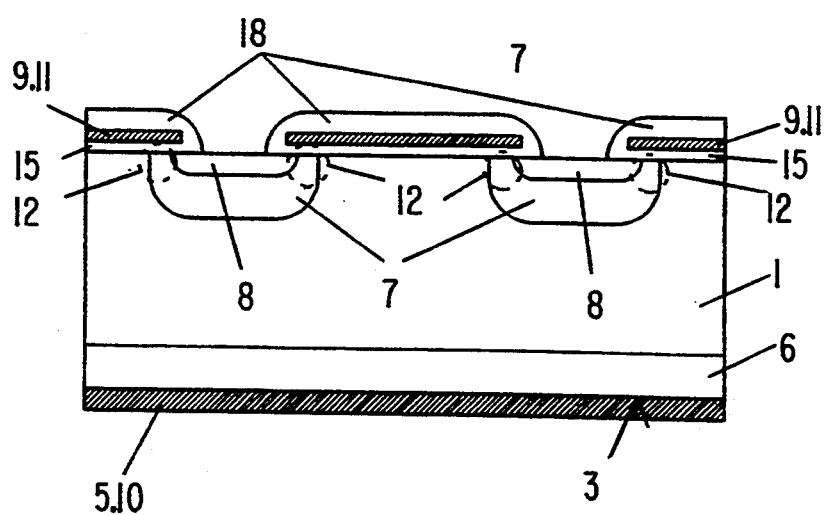
FIG. 2c shows the IGBT according to FIG. 2a in section along plane B—B.

FIGS. 2a–c show a further variant which only differs from that of FIGS. 1a–c in that the source regions of two collector regions are arranged directly oppositely. Accordingly, only one or, respectively, two source regions (8) are shown in the sections (along axes A—A and, respectively, B—B) 1c and 2c.

In the arrangement of the source regions (8) according to FIGS. 1a–c and, respectively, 2a–c, a comparatively high current saturation characteristic or, respectively, high short-circuit current carrying capability can be additionally achieved by wide intermediate spaces between the source regions (8). This means that a comparatively long period before detection of the short-circuit can be tolerated. In the case of an application of the novel cathode pattern for a high-voltage IGBT having a very high charge carrier life and a large n-type base width, the contribution of the channel region (12) to the forward voltage drop is negligible in first approximation. It can thus be quite easily tolerated to design the component with a minimum number of source regions (for which the maximum collector area is contacted by the cathode).

To achieve the highest possible reverse voltages, a cathode pattern which, similarly to the MCT or GTO, has a larger area than p-type base (or, respectively, collector in the IGBT) would also be desirable for an IGBT. Using the cathode pattern according to the invention, this can now also be achieved in the case of the IGBT.

Figure 3:
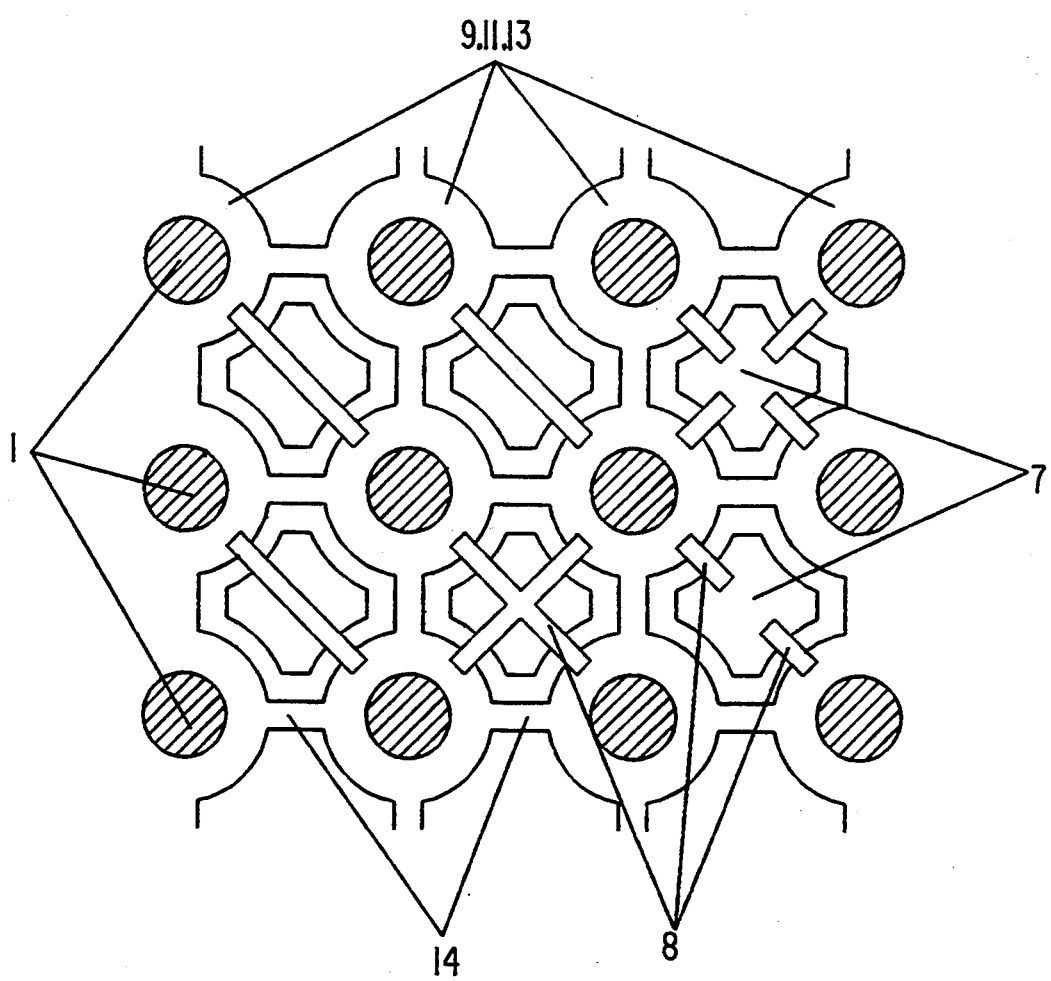
FIG. 3 shows the top view of the cathode pattern of an IGBT according to a second illustrative embodiment.

FIG. 3 shows such an implementation from above. Attention must be paid to the fact that various patterns such as masks, polysilicon edges, collector regions or semiconductor substrate sections are drawn above one another in this figure.

The cathode pattern according to FIG. 3 comprises a continuous collector region (7). This collector region (7) exhibits a number of holes in which the semiconductor substrate (1) penetrates to the surface (2). These holes are covered with the gate oxide layer (15) (not visible) and with the conducting gate layer (11). This forms gate electrode islands (13). The diameter of the gate electrode islands (13) is larger than that of the semiconductor substrate sections (1) penetrating to the surface, so that the latter are completely covered. Adjacent gate electrode islands (13) are connected via narrow bridges (14) of the conducting layer (11). This grid of gate electrode islands (13) connected by means of bridges (14) is used as doping mask for the coherent collector region (7). Accordingly, the bridges (14) must be designed to be so narrow that during the diffusion, the lateral diffusion fronts flow together under the bridges (14). Typical values are from 10 $\mu$m to 20 $\mu$m for the diameters of the gate electrode islands and about 3 $\mu$m for the bridge width.

Such a cathode pattern is then provided with source regions (8). Naturally, their width must be selected as in connection with the illustrative embodiments according to FIGS. 1a–c to 2a–c. A number of possibilities are indicated in FIG. 3. For example, strip-shaped source regions (8) are drawn which essentially extend from one gate electrode island (13) to that diagonally opposite. Similarly, the source regions (8) can exhibit a cross-shaped pattern. The same patterns can also be constructed to be interrupted. In this case, the source region (8) in each case only extends from an electrode island (13) and from the diagonally opposite electrode island (13) to the adjacent collector region (7). This provides the pattern of an interrupted strip or of an interrupted cross.

Imagining, then, a section which is carried out from the top left to the bottom right in FIG. 3 along the source strips (8), precisely the pattern shown in FIG. 2c is obtained.

The above explanations were made with reference to the example of strip- or cross-shaped source regions. However, this was only done for the sake of simplicity. Other shapes of source regions are similarly conceivable and must be designed in such a manner that the holes can flow away laterally into the surrounding collector regions.

In the text which follows, a method for producing an IGBT according to the invention is also explained with reference to FIGS. 4a–f. It is assumed in this connection that the anode pattern and any edge termination, neither of which are shown, have already been created.

Figure 4A:
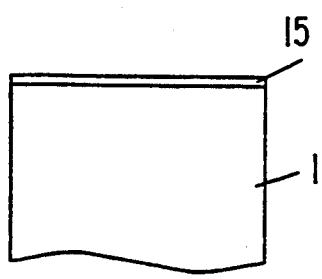
FIGS. 4a–f show IGBTs according to the invention in section at various production stages.
Figure 4D:
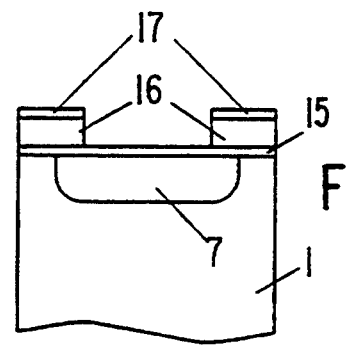
Figure 4B:
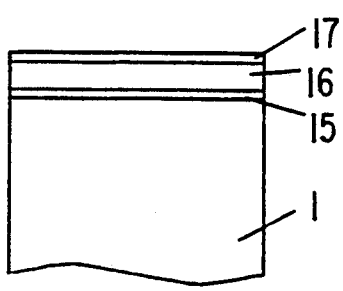
Figure 4E:
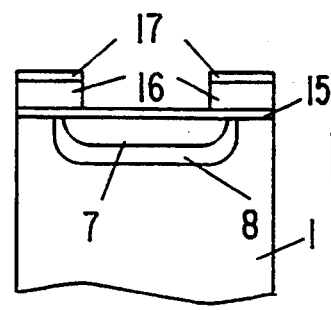
Figure 4C:
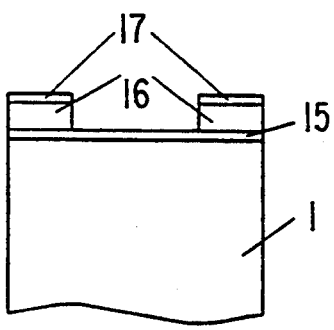

After a gate oxide layer (15), FIG. 4a, has been grown, a polysilicon layer (16) is applied which is covered with an $SiO_2$ masking layer (17), FIG. 4b. The polysilicon layer (16) represents the conducting layer (11) and will later form the gate electrode (9). Polysilicon layer (16) and silicon layer (17) are then removed at the locations at which no gate electrode is to be created, FIG. 4c. The patterned polysilicon layer (16) is used as mask for the next implantation step with, for example, boron or boride fluoride and for the subsequent diffusion. This provides the collector region (7), FIG. 4d. The implantation dose must be selected in such a manner that the required forward voltage can be achieved, It is, then, essential for the invention that the same polysilicon layer (16) is also used as mask for the subsequent source region implantation with phosphorus or arsenic. For this purpose, the collector regions (7) are covered with resist at the locations where no source regions (8) are to be produced. After the diffusion which, at the same time, provides n+-type doping for the polysilicon layer (16), the situation shown in FIG. 4e is obtained.

Figure 4F:
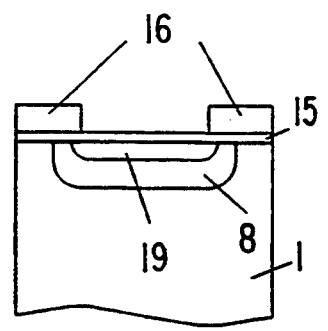

If the original doping of the collector regions (7) is not sufficiently high for providing the cathode contacts with an ohmic characteristic, a shallow high-dose boron implantation can also subsequently be carried out, FIG. 4f. In turn, the polysilicon layer (16) is used as mask for this. Care must be taken to see that the edge concentration of the source regions (8) is distinctly higher (for example by a factor of 5) than that of the second boron implantation, The subsequent steps are assumed to be known and comprise insulation of the gate electrode with the gate insulation layer (18), contact hole opening in the gate oxide layer (15) and metallization of the cathode (4).

The method according to the invention thus provides IGBTs, the collector regions and source regions of which can be produced to be completely self-aligning. As a result, the method becomes simple, on the one hand, and, on the other hand, the efficiency of the component can be fully utilized due to the homogeneous turn-off current distribution. It must be considered to be a further advantage that the IGBT according to the tcwinvention exhibits a high latch-up resistivity due to the special pattern of the source regions.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An insulated-gate bipolar transistor comprising a semiconductor substrate of a first conduction type which is bounded by a first and a second main area;

a cathode which is allocated to the first main area, and an anode which is formed by a metallization covering the second main area;

an emitter layer of a second conduction type which is inserted into the semiconductor substrate from the anode-side main area;

a plurality of collector regions of the second conduction type which are inserted into the semiconductor substrate from the cathode-side main area, the semiconductor substrate penetrating to the cathode-side main area between two adjacent collector regions;

a gate electrode which is formed by a conducting layer which is arranged and insulated above the cathode-side main area and extends from a collector region over the semiconductor substrate penetrating to the surface to the adjacent collector region;

a number of source regions of the first conduction type which are inserted into the collector regions and which exhibit a length L and at right angles thereto a width W in the direction of an adjacent collector region; wherein the length L of the source regions is selected such that there are at least two channel regions produced for each source region, the channel regions comprising a part of a collector region which penetrates to the cathode-side main area between the source region and semiconductor substrate and which is covered by the gate electrode, the width of the source regions is selected to be of the order of magnitude of microns such that holes which flow from the anode to the cathode underneath the source regions polarize a PN-junction which is formed by the source regions and the adjacent collector regions in the forward direction, and such that a voltage drop across said PN-junction remains below the inbuilt forward voltage of the PN junction at any time.

2. IGBT as claimed in claim 1, wherein the collector regions are designed to be strip-shaped.

3. IGBT as claimed in claim 2, wherein the source regions of two adjacent collector regions are in each case arranged alternately opposite.

4. IGBT as claimed in claim 2, wherein the source regions of two adjacent collector regions are in each case arranged to be directly opposite.

5. IGBT as claimed in claim 1, wherein the collector regions form a closed area, this area exhibiting a number of holes in which the semiconductor substrate penetrates to the cathode-side surface;

these holes are covered with the conducting gate electrode layer and form gate electrode islands; and two adjacent gate electrode islands are connected via narrow bridges of the conducting layer.

6. IGBT as claimed in claim 5, wherein the bridges are so narrow that the collector regions flow together underneath the bridges in a diffusion step during the production.

7. IGBT as claimed in claim 5, wherein the gate electrode islands exhibit the form of a circle or of a polygon, especially of a hexagon.

8. IGBT as claimed in claim 5 wherein the source regions are designed as narrow strips which essentially extend from one gate electrode island to the diagonally opposite one.

9. IGBT as claimed in claim 6 wherein the source regions are designed as narrow strips which essentially extend from one gate electrode island to the diagonally opposite one.

10. IGBT as claimed in claim 7 wherein the source regions are designed as narrow strips which essentially extend from one gate electrode island to the diagonally opposite one.

11. IGBT as claimed in claim 5, wherein the source regions are designed as narrow crosses which extend from one gate electrode island to the diagonally opposite one.

12. IGBT as claimed in claim 6, wherein the source regions are designed as narrow crosses which extend from one gate electrode island to the diagonally opposite one.

13. IGBT as claimed in claim 7, wherein the source regions are designed as narrow crosses which extend from one gate electrode island to the diagonally opposite one.

14. Method for producing an IGBT which comprises the steps of:

patterning a cathode-side surface after creation of the anode and any edge termination, by means of the following steps:

deposition of a gate oxide layer;

deposition of a polysilicon layer which is covered with an $SiO_2$ masking layer;

removal of the polysilicon layer at the locations where no gate electrode is to be created;

implantation and diffusion of the collector regions, the polysilicon layer being used as implantation mask;

covering of the collector regions with resist at the locations where no source region is to be created:

implantation and diffusion of the source regions and simultaneous doping of the silicon layer to become the gate electrode, the polysilicon layer for the source regions, in turn, being used as implantation masks; and insulation of the gate electrode, contact hole opening and metallization of the cathode.

15. A method as claimed in claim 14, further comprising subjecting the collector regions to an additional implantation step after the implantation and diffusion of the source regions.

* * * * *